(12) United States Patent
Henocq et al.

(10) Patent No.: US 8,638,848 B2
(45) Date of Patent: Jan. 28, 2014

(54) VIDEO TRANSMISSION METHOD AND DEVICE

(75) Inventors: Xavier Henocq, Melesse (FR); Patrice Onno, Rennes (FR); Fabrice Le Leannec, Mouaze (FR)

(73) Assignee: Canon Kabushiki Kaisha, Tokyo (JP)

( * ) Notice: Subject to any disclaimer, the term of this patent is extended or adjusted under 35 U.S.C. 154(b) by 630 days.

(21) Appl. No.: 12/595,953

(22) PCT Filed: Jun. 27, 2008

(86) PCT No.: PCT/IB2008/002715
§ 371 (c)(1),
(2), (4) Date: Oct. 14, 2009

(87) PCT Pub. No.: WO2009/010882
PCT Pub. Date: Jan. 22, 2009

(65) Prior Publication Data
US 2010/0132002 A1  May 27, 2010

(30) Foreign Application Priority Data
Jul. 3, 2007 (FR) .................................... 07 56243

(51) Int. Cl.
*H04N 7/173* (2011.01)
(52) U.S. Cl.
USPC .................................................. 375/240.01
(58) Field of Classification Search
USPC ......................................................... 375/240
See application file for complete search history.

(56) References Cited

U.S. PATENT DOCUMENTS

| | | | |
|---|---|---|---|
| 6,275,531 B1 * | 8/2001 | Li | 375/240.12 |
| 6,937,769 B2 | 8/2005 | Onno | |
| 2004/0076332 A1 * | 4/2004 | Lin et al. | 382/236 |
| 2007/0081580 A1 * | 4/2007 | Breiling | 375/150 |
| 2007/0086527 A1 * | 4/2007 | Yan | 375/240.24 |
| 2009/0138773 A1 | 5/2009 | Henocq et al. | |
| 2009/0232200 A1 | 9/2009 | Henocq et al. | |
| 2009/0296821 A1 | 12/2009 | Henocq et al. | |

OTHER PUBLICATIONS

A.W.Rix, A.Bourret and M.P.Hollier, "Models of Human Perception", BT Technology Journal, vol. 17, No. 1, 1999, p. 24-34.*

(Continued)

*Primary Examiner* — Sath V Perungavoor
*Assistant Examiner* — Kate Luo
(74) *Attorney, Agent, or Firm* — Fitzpatrick, Cella, Harper & Scinto (57) ABSTRACT

The method of transmitting a video stream over a network between a transmission device and at least one reception device comprises: —a step (502) of encoding so-called "primary" data of the video stream according to a first type of encoding, —a step (516, 518) of obtaining so-called "secondary" video data, dependent on the primary data, by the simulation of transmission errors potentially suffered by the video stream and at least one method of masking losses due to said transmission errors able to be implemented by a reception device able to decode the primary video stream encoded according to the first type of encoding, —a step (520, 522) of encoding secondary data according to a second type of encoding different from the first type of encoding, and —a step of transmitting, by means of the network, primary data encoded according to the first type of encoding and at least some of the secondary data encoded with the second type of encoding.

18 Claims, 8 Drawing Sheets

(56) References Cited

OTHER PUBLICATIONS

S. Rane, P. Baccichet, and B. Girod, "Modeling and Optimization of Systematic Lossy Error Protection System based on H.264/AVC Redundant Slices," Proc. International Picture Coding Symposium, Beijing, P. R. China, Apr. 2006.*

Gary Sullivan, et al., Text of ISO/IEC 14496 10 Advanced Video Coding 3rd Edition, Coding of Moving Pictures and Audio, Jul. 2004, pp. 1-314, Draft Edition of ITU-T, International Organization of Standardization.

S. Rane, et al., "Analysis of Error-Resilient Video Transmission Based on Systematic Source-Channel Coding", Picture Coding Symposium 2004, [Online], Dec. 17, 2004, pp. 1-6, XP002472188.

A. Wyner, et al., "The Rate-Distortion Function for Source Coding with Side Information at the Decoder", IEEE Transactions on Information Theory, vol. IT-22, No. 1, Jan. 1976, pp. 1-10.

P. Baccichet, et al., "Systematic Lossy Error Protection Based on H.264/AVC Redundant Slices and Flexible Macroblock Ordering", Journal of Zhejiang University Science A, 2006, pp. 900-909.

S. Wenger, et al., "RTP Payload Format for SVC Video", Internet Draft draft-wenger-avt-rtp-svc-03.txt, Oct. 2006, pp. 1-40.

S. Wenger, et al., "RTP Payload Format for H.264 Video", RFC3984, Feb. 2005, pp. 1-83.

* cited by examiner

VIDEO TRANSMISSION METHOD AND DEVICE

This application is a National Stage application under 35 U.S.C. §371 of International Application No. PCT/IB2008/002715, filed on Jun. 27, 2008, which claims priority to French Application No. 0756243, filed on Jul. 3, 2007, the contents of each of the foregoing applications being incorporated by reference herein.

The present invention concerns a video transmission method and device. It applies in particular to video transmission on channels with loss.

The H.264 standard constitutes the state of the art in terms of video compression. It is in particular described in the document "G. Sullivan, T. Wiegand, D Marpe, A. Luthra, Text of ISO/IEC 14496-10 Advanced Video Coding, $3^{rd}$ Edition". This standard developed by the JVT Group (the acronym for "Joint Video Team") has made it possible to increase compression performance significantly compared with other standards such as MPEG-2, MPEG-4 part 2 and H.263. In terms of technology, the H.264 standard relies on a hybrid encoding scheme based on a combination of spatial transformations and motion prediction/compensation. The transformations used have however changed since the conventional 8×8 DCT (the acronym for "discrete cosine transform") has been replaced by a 4×4 DCT. Moreover the motion prediction takes place now with a precision of ¼ of a pixel and a picture can make reference to several pictures in its vicinity. New tools have been introduced, including for example:

- CABAC (the acronym for "Context-Adaptive Binary Arithmetic Coding"),
- CAVLC (the acronym for "Context-Adaptive Variable Length Coding"),
- redundant slices,
- SI (the acronym for "switching intra") and SP (the acronym for "switching predictive") pictures.

It will be recalled that passage pictures (called "SP" and "SI") make it possible to pass from a first picture to a second picture, the first and second pictures not necessarily belonging to the same video stream and the two pictures not being successive in time.

Redundant slices make is possible to code in one and the same bitstream a main version of a picture (or of a slice) with a given quality and a second version with a lower quality. If the main version of the picture is lost during transmission, its redundant version will be able to replace it.

SVC is a new video coding standard taking as its basis the compression techniques of the H.264 standard. The technological advances of SVC concern mainly scalability of the video format. This is because this new video format will have the possibility of being decoded in a different manner according to the capabilities of the decoder and the characteristics of the network. For example, using a high-resolution video of the SD type (the acronym for "standard definition"), of definition 704×576 and frequency 60 Hz, it will be possible to code, in a single bitstream, using two "layers", the compressed data of the SD sequence and those of a sequence to the CIF format (the acronym for "common intermediate format"), which provides a rate of 60 pictures/second with a definition of 352×288. To decode the CIF resolution, the decoder will decode only some of the information coded in the bitstream. Conversely, it will have to decode all the bitstream in order to restore its SD version.

This example illustrates the spatial scalability functionality, that is to say the possibility, from a single stream, of extracting videos where the sizes of the pictures are different.

It should also be noted that, for a given picture size and for a given time frequency, it will be possible to decode a video by selecting the required quality according to the capacity of the network. This illustrates the three main scalability features offered by SVC, namely spatial, temporal and quality scalabilities (also referred to as "SNR", the acronym for "signal to noise ratio").

The present invention is situated in the field of video transmission from a server to a client. It applies particularly when the transmission network is not reliable and losses occur in the data transmitted.

In the article "The Rate-Distortion Function for Source Coding with Side Information at the Decoder" (IEEE Tr. On Information Theory, Vol. rr-22, No. 1, January 1976.), the Wyner-Ziv theorem is proposed.

According to this theorem, if there are two sources of independent copies of dependent random variables (X, Y), then the rate for a distortion "d" when the encoder and decoder have parallel information ($R_{x/y}(d)$) is less than or equal to the rate when only the decoder has parallel information ($R^*_y(d)$).

Figure 1A:
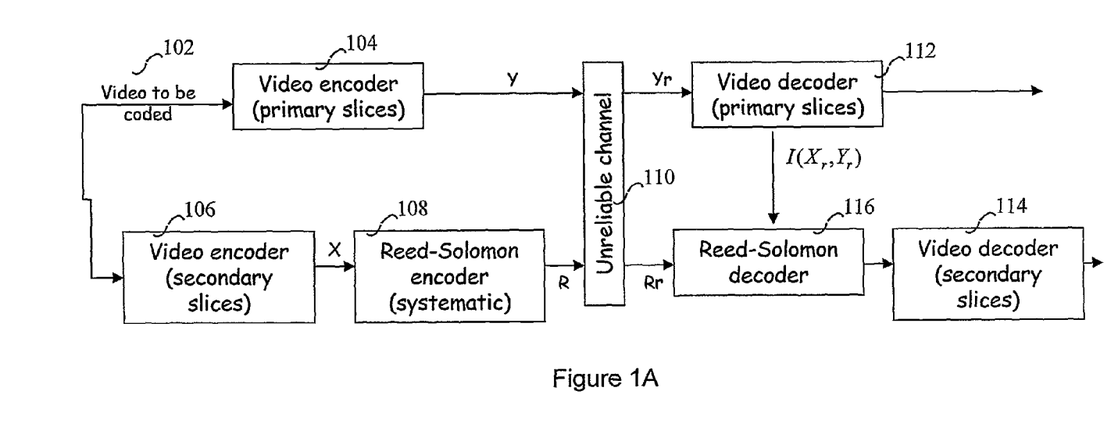
FIGS. 1A and 1B illustrate, schematically, the Wyner-Ziv theorem.
Figure 1B:
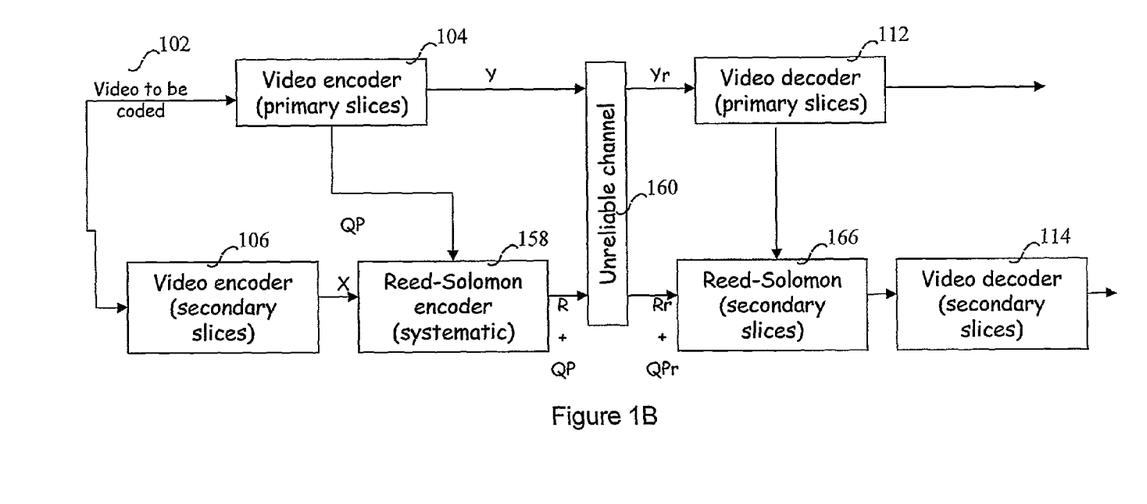

FIGS. 1A and 1B illustrate this theorem. In FIG. 1A a video 102 is compressed by two video encoders 104 and 106. These two video encoders 104 and 106 generate only "intra" (that is to say not predicted) pictures in the form of primary slices at a quality d1 and secondary slices at a quality d2 (d1 being higher than or equal to d2). The primary slices are transmitted over an unreliable network 110. It is assumed here that the primary and secondary slices all have an encoded representation (binary representation) of the same size and that they are sent in groups of N packets, each packet containing a slice. N secondary slices are sent to the input of a channel coder 108 of the "Reed-Solomon" type, denoted "RS", which is systematic, of parameters N and R. On the reception side, three decoders 112, 114, and 116 correspond respectively to the encoders 104, 106 and 108. It should be noted that the Reed-Solomon encoder 108 and decoder 116 here fulfill the role of Wyner-Ziv encoders and decoders.

The parameter R represents the quantity of redundancy added by the encoder. In order words, a set of N+R packets is found at the output of the encoder. It will be recalled that, when an encoder is systematic, the N input packets of the channel encoder are found again at the output of the associated encoder with K redundant packets. The advantage of a systematic channel encoder is that, if no loss is found during the transmission, the data can be recovered directly without having to perform the RS decoding.

The secondary slices are not transmitted over the channel. Only the R redundant data issuing from the RS encoding is transmitted.

During transmission over the channel, a certain number of primary slices and redundant data is lost. So that the RS decoding can be carried out without loss, it is necessary to receive at least N packets among the packets representing the secondary slices and the redundant packets. Here, the secondary slices not being transmitted, it is necessary for the client to regenerate them. For this purpose, the client can rely on the primary slices received and on the intercorrelation $I(X_r, Y_r)$ between the primary and secondary data, the secondary slices obtained then constituting the parallel information of the Wyner-Ziv decoder. However, the regeneration of the secondary slices from this parallel information alone is a difficult problem having a solution only if sufficient correlation has been maintained between the primary and secondary slices. The most simple means is to generate, at the server, identical primary and secondary slices. This solution is ineffective since it involves a high transmission rate from the server.

On the other hand, in FIG. 1B, the Reed-Solomon encoder 158 (fulfilling the role of a Wyner-Ziv encoder), also receives parallel information. This parallel information represents the quantization parameters used by the primary video encoder 104 and those used by the secondary encoder 106. The server then transmits the redundant packets and this parallel information. Using this parallel information and the primary slices received, the client can regenerate a certain number of secondary slices which, if it is sufficient, makes it possible, at the output of the Reed-Solomon decoder 166, to recover all the secondary slices transmitted. Here sending quantization parameters QP increases the rate of the server, but this increase is compensated for by the fact that, compared with the diagram in FIG. 1A, it is not necessary to maintain a correlation between the primary and secondary slices. According to the Wyner-Ziv theorem, the rate of the server in FIG. 1B is less than or equal to the rate of the server in FIG. 1A.

Figure 2:
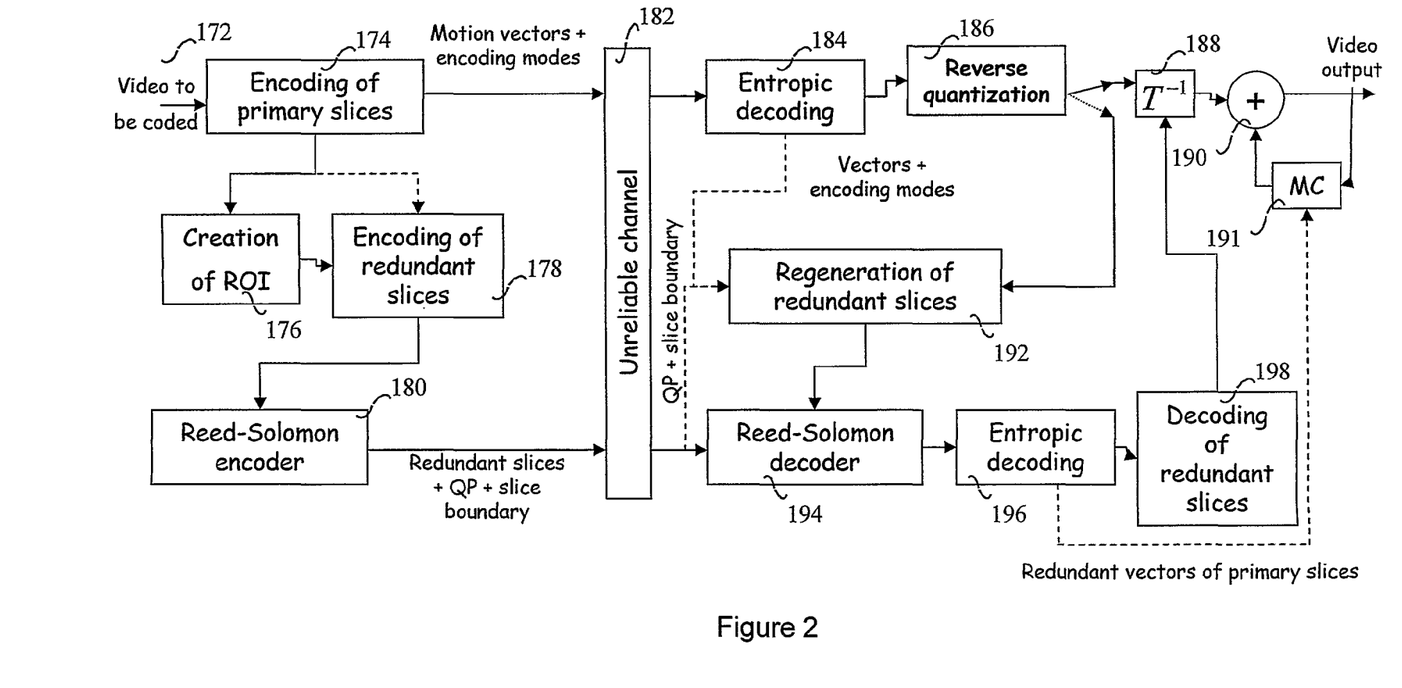
FIG. 2 depicts, schematically, an encoder and a decoder implementing a so-called "SLEP" method.

With regard to the method called "SLEP", in their article "Systematic Lossy Error Protection (SLEP)" (Journal of Zhejiang University, 2006), the authors, Baccichet et al, propose an error control method adapted to video transmission over an unreliable channel. This method is illustrated in FIG. 2. This diagram repeats the idea of FIG. 1B. A video 172 is encoded by an H.264 encoder fulfilling functions of encoding primary slices 174 and encoding redundant slices 178. This encoder thus generates high-quality primary slices and redundant slices (as defined by the standard) constituting the secondary slices. The secondary slices keep the same motion vectors and the same methods of encoding by macroblocs as the primary slices. In order to reduce the transmission rate of the redundant slices, a region of interest module 176, denoted "ROI" (the acronym for "region of interest") extracts the most important areas of the pictures. The data representing redundant slices is supplemented by information representing primary slices such as the quantization parameters QP. All this redundant data is transmitted to a systematic Reed-Solomon encoder 180 that generates redundant packets and inserts the quantization parameters and information representing boundaries of redundant slices in packets. A network module (not shown) transmits the primary slices and the redundant data over the network 182.

The network 182 not being reliable, primary slices and redundant data may be lost during transmission. An entropic decoding 184 and a reverse quantization 186 are performed on the slices received. When the number of primary slices and the redundant data correctly received and decoded makes it possible to envisage channel decoding, a Wyner-Ziv decoding procedure is implemented. This consists of regenerating some of the redundant slices, function 192, by virtue of the primary slices and the information representing the quantization parameters QP. All this information represents here the parallel information of the decoder. The secondary slices regenerated and the redundant data received are transmitted to a Reed-Solomon decoder 184 that then generates the missing secondary slices. The secondary slices are then decoded by entropic decoding 196 and decoding of redundant slices 198 and then injected into the decoding path of the primary slices in order to replace the lost primary slices.

The SLEP approach does not take into account the loss masking capacities of the decoder. This is because, in the case of losses, a conventional decoder implements procedures aimed at attenuating the visual impact of the losses. These procedures usually consist of spatial or temporal interpolations from the zones received. These procedures may prove to be very effective, even more effective than the replacement of a lost slice with a secondary slice. In other words, the SLEP approach does not ensure that the video obtained is of better quality than that which would have been able to have been obtained by loss masking. In addition, the SLEP method gives rise to a not insignificant rate for the redundant data even if it is partly compensated for by the use of regions of interest called ROI. This is because the generation of the redundant slices is suboptimal since it relies on the motion vectors and the methods of encoding the primary slices and it is necessary to transmit the quantization parameters and the slice boundaries.

The present invention aims to remedy these drawbacks.

To this end, according to a first aspect, the present invention relates to a method of transmitting a video stream over a network between a transmission device and at least one reception device, characterized in that it comprises:

a step of encoding so-called "primary" data of the video stream according to a first type of encoding, a step of obtaining so-called "secondary" video data, dependent on the primary data, by the simulation of transmission errors potentially suffered by the video stream and at least one method of masking losses due to said transmission errors able to be implemented by a reception device able to decode the primary video stream encoded according to the first type of encoding, a step of encoding secondary data according to a second type of encoding different from the first type of encoding, and a step of transmitting, by means of the network, primary data encoded according to the first type of encoding and at least some of the secondary data encoded with the second type of encoding.

By virtue of these provisions, the loss masking is taken into account in the calculation of the secondary data, for example redundant slices. This has the advantage of ensuring that there is obtained, on decoding, results at least equal to those that would be obtained by applying solely a loss masking. In addition, when the loss masking is of high performance, the method generates redundant slices having a very low rate. Finally, it is no longer necessary to use ROIs.

According to particular characteristics, during the step of obtaining secondary video data, the difference is calculated between at least one version of the video stream that has undergone simulation of transmission errors and a simulated loss masking and the version encoded according to the first type of encoding.

According to particular characteristics, during the step of encoding the secondary data, said difference is encoded.

According to particular characteristics, during the step of encoding the secondary data, redundant information is calculated on this difference in order to supply secondary data.

According to particular characteristics, during the transmission step, this redundant information is transmitted in the form of data packets in which information enabling the client to regenerate the secondary data is inserted.

According to particular characteristics, during the transmission step, the information making it possible to regenerate the differences comprises a loss masking method identifier used for determining the secondary data.

Thus a plurality of loss masking methods can be implemented by the coder, without needing to have prior knowledge of the loss masking methods actually used by the reception device, since the server and client or clients share a set of masking method identifiers.

According to particular characteristics, during the transmission step, the information making it possible to regenerate the differences comprises an identifier of a loss configuration used for determining the secondary data.

According to particular characteristics, during the step of obtaining secondary data, the loss masking is simulated only for loss configurations in which at most a predetermined number of primary packets are lost among the primary packets transmitted.

It is in fact not necessary to simulate loss configurations for which the reception device is not able to implement the masking of losses and/or the decoding of the encoded secondary data.

According to particular characteristics, the step of encoding secondary data comprises a step of quantizing the secondary data, during which account is taken of the probability of occurrence of loss configurations and more rate is allocated to the most probable configurations.

According to particular characteristics, during the primary data encoding step, an SVC encoding is implemented.

This is because, although suited to any video standard, the present invention is particularly advantageous in the context of SVC.

According to particular characteristics, during the step of obtaining secondary video data, a loss masking using a base layer and an enhancement layer is simulated.

Advantageously, in the context of SVC encoding, a single loss masking method is considered, which makes it possible to simplify the processing of the video stream. The masking of the losses of an enhancement layer from the base layer is particularly suited to the SVC encoding format.

According to particular characteristics, during the secondary data encoding step, a Reed-Solomon encoding is implemented.

According to particular characteristics, during the step of obtaining secondary data, when the loss masking is simulated, for the most probable loss configuration, a process is applied of selecting a loss masking method implemented by the reception device, in order to supply at least one decoded version of the video data, each version representing the video as would be displayed by the client in a given loss configuration.

According to a second aspect, the present invention relates to a method of receiving a video stream on a network coming from a transmission device, characterized in that it comprises:
- a step of receiving primary data and information representing secondary data of a video stream,
- a step of decoding primary data according to a first decoding type,
- a step of primary data loss masking,
- a step of calculating differences between the decoded primary data and the data resulting from the loss masking;
- a step of obtaining so-called "secondary" video data, by implementing, on the information representing secondary data, a second type of decoding different from the first type of decoding and said differences,
- a step of combining the primary data and secondary data in order to generate a video stream.

According to particular characteristics, during the combination step, the secondary data is added to the primary data.

According to particular characteristics, during the step of obtaining secondary video data, the loss configuration used during the primary data loss masking step is compared with a plurality of loss configurations for which secondary data has been received in order to determine secondary data corresponding to said loss configuration.

According to particular characteristics, during the step of obtaining secondary video data, the loss of received images and the masking of these losses are simulated, in order to determine a difference between decoded primary data and their version on which a loss masking has been simulated.

According to a third aspect, the present invention relates to a device for transmitting a video stream to at least one reception device, characterized in that it comprises:

- a means of encoding so-called "primary" data of the video stream according to a first type of encoding;
- a means of obtaining so-called "secondary" video data, dependent on the primary data, by the simulation of transmission errors potentially suffered by the video stream and at least one method of masking losses due to the said transmission errors and able to be implemented by a reception device suitable for decoding the primary video stream encoded according to the first type of encoding,
- a means of encoding secondary data according to a second type of encoding different from the first type of encoding, and
- a means of transmitting, by means of the network, primary data encoded according to the first type of encoding and at least some of the secondary data encoded with the second type of encoding.

According to a fourth aspect, the present invention relates to a device for receiving a video stream on a network coming from a transmission device, characterized in that it comprises:
- a means of receiving primary data and information representing secondary data of a video stream,
- a means of decoding primary data according to the first type of decoding,
- a means of masking primary data losses,
- a means of calculating differences between the decoded primary data and the data resulting from the loss masking,
- a means of obtaining so-called "secondary" video data, by implementing, on the information representing secondary data, a second type of decoding different from the first type of decoding and said differences, and
- a means of combining the primary data and secondary data in order to generate a video stream.

According to a fifth aspect, the present invention relates to a computer program that can be loaded into a computer system, said program containing instructions for implementing the transmission method and/or the reception method as succinctly disclosed above.

According to a sixth aspect, the present invention relates to an information carrier that can be read by a computer or a microprocessor, removable or not, storing instructions of a computer program, characterized in that it permits the implementation of the transmission method and/or reception method as succinctly disclosed above.

The advantages, aims and characteristics of this reception method, of these devices, of this program and of the information carrier being similar to those of the transmission method that is the object of the present invention, as succinctly disclosed above, they are not repeated here.

Other advantages aims and characteristics of the present invention will emerge from the following description given, for explanatory purposes and which is in no way limiting, with regard to the accompanying drawings, in which.

FIGS. 1A, 1B and 2 have already been described during the discussion of the known video stream transmission devices.

Figure 3:
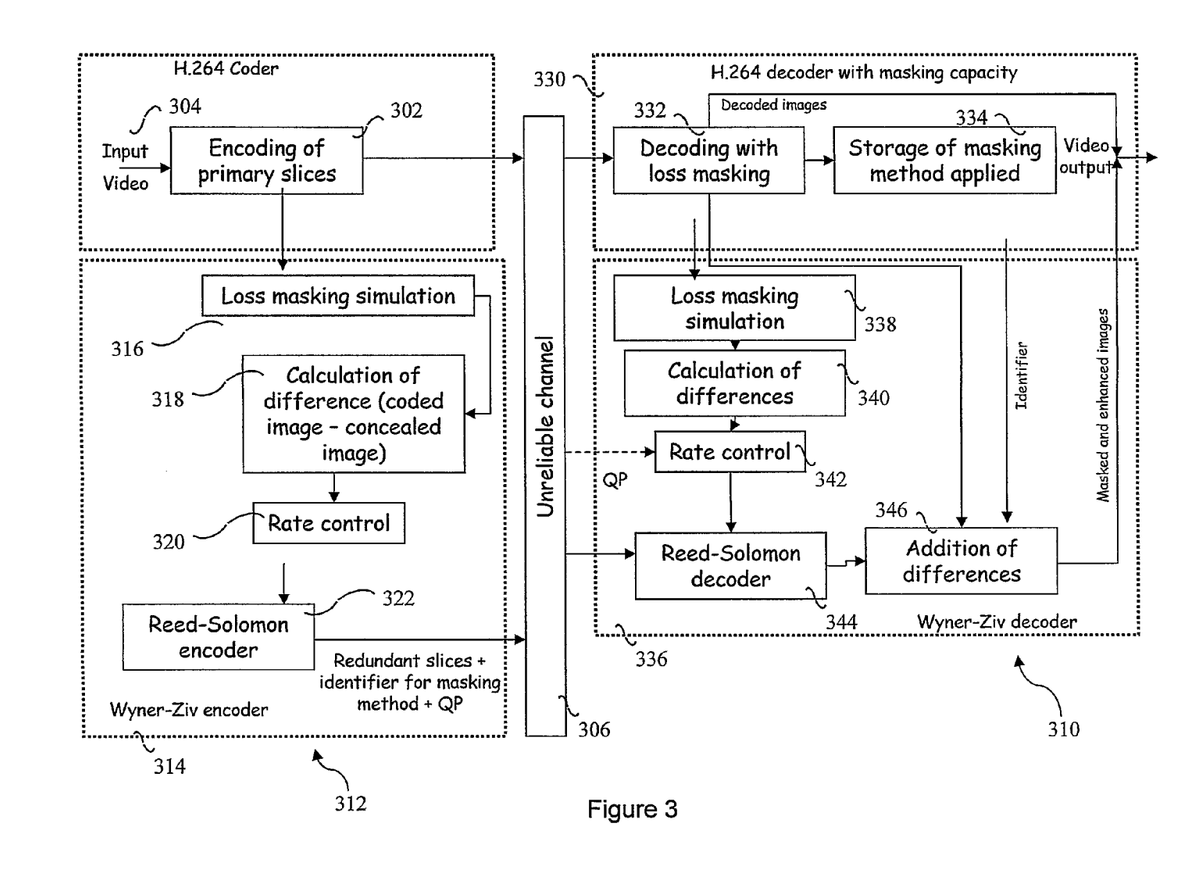
FIG. 3 depicts, schematically, a first embodiment of the transmission device and of the reception device that are the objects of the present invention.

There can be seen, in FIG. 3, a first embodiment adapted to the case of any video transmission application but described in the case of an H.264 encoding. Thus other video compression standards could be used (MPEG-2, MPEG-4 part 2, H.263, Motion JPEG, Motion JPEG2000 etc) without substantial modifications to the means illustrated in FIG. 3.

There can be seen, in FIG. 3, an encoder 302 implementing the H.264 standard in order to encode an input video 304, in the form of slices that will hereinafter be referred to as "primary" slices. Each primary slice is inserted in RTP packets (the acronym for "real-time transport protocol") according to the format described in the document of S. Wenger, M. Hannuksela, T. Stockhammer, M. Westerlund and D. Singer, "RFC3984, RTP payload format for H.264 video", published in February 2005, and then transmitted over a network 306 by a network transmission module (not shown). It is assumed that a congestion control mechanism, of a known type, regulates the sending of the RTP packets over the network. In addition, the reception device 310 of the client acknowledges each packet received so that the sending device 312, here a server, knows which packets have been received and which packets have been lost.

A Wyner-Ziv encoder 314, inserted in the transmission device, comprises the means 316 to 322. As soon as a group of $N_{prim}$ primary slices has been generated, the simulation means 316 simulates the loss masking methods that would be implemented by the reception device 310 of the client in the event of losses of packets among the $N_{prim}$ packets transmitted. In the general case, the reception device 310 of the client is capable of implementing several loss masking methods. It can, for example, carry out a spatial loss masking or a temporal loss masking.

Figure 5:
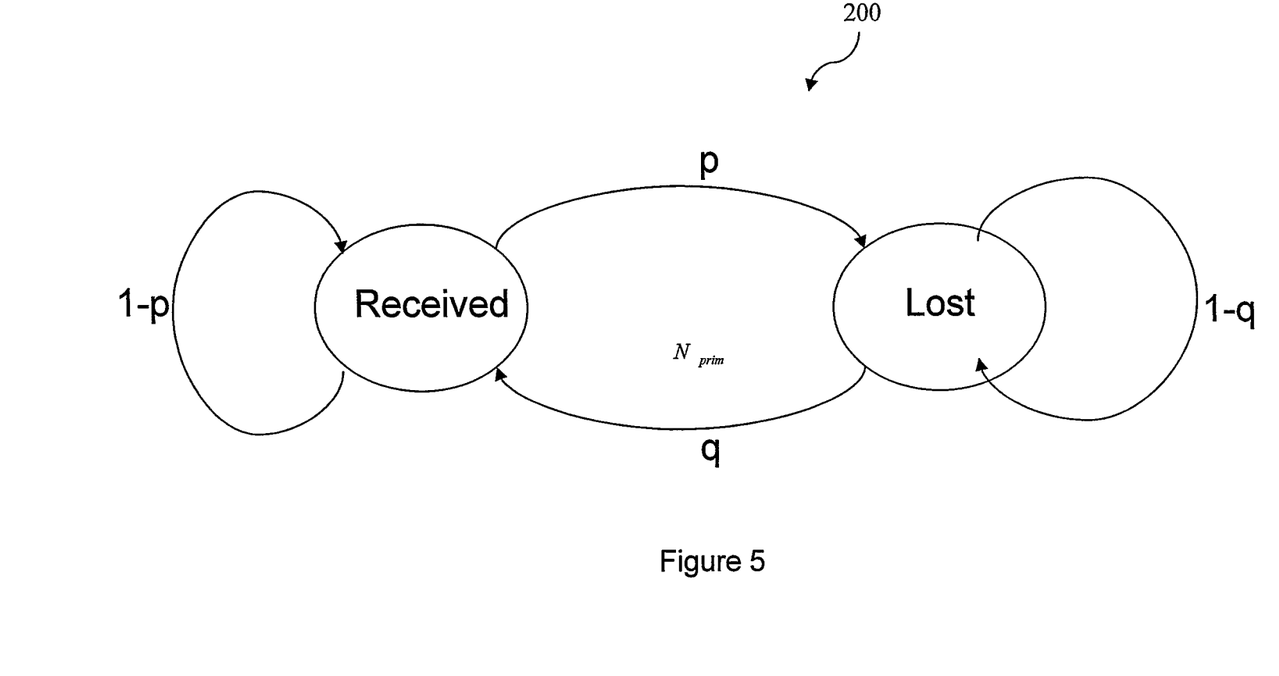
FIG. 5 depicts, schematically, a model for data packet loss on a network.

The simulation of the loss masking assumes having a knowledge of the loss process on the network. The transmission device 312 receiving an acknowledgement for each packet transmitted, the simulation means 316 is capable of calculating the parameters of a loss model on the network. It is generally accepted that the loss models on the network are memory models. The Elliot-Gilbert model 200 shown in FIG. 5 is particularly adapted to this case. This is a two-state model (a "received" state and a "lost" state) and probabilities of transition p and q between the states.

In embodiments, the simulation means 316 simulates all the possible loss configurations between the last primary slice acknowledged and the current slice. If N is the number of packets transporting the slices transmitted since the last primary slice acknowledged, the simulation means 316 simulates all the configurations from 1 to N loses. For example if N packets separate the last packet acknowledged and the packet containing the current slice, the number of possible loss configurations is $$\sum_{k=1}^{N} \frac{N!}{k!(N-k)!}.$$

The number of possible configurations may be reduced if, among the N primary packets transmitted, a certain number were acknowledged before the Wyner-Ziv encoding.

For each of the possible loss configurations, the simulation means 316 applies the loss masking by applying the same process of selecting a loss masking method as the reception device of the client. A process of selecting a loss masking method may, for example, consist of applying a temporal loss masking when the slices contained in a lost packet correspond to an image, and a spatial loss masking when the slices correspond to a portion of an image. It is assumed here that all the macroblocs of a slice are subjected to the same loss masking method.

At the output of the simulation means 316, several decoded versions of the video had been generated, each version representing the video as would be displayed by the client in a given loss configuration.

A calculation means 318 performs, for each of the loss configurations obtained, the calculation of the difference between the images issuing from the loss masking and the primary images that would correspond to them temporally.

An encoding means 320 encodes each of the differences. The macroblocs of a difference image are treated as residue macroblocs issuing from the motion prediction. The encoding means 320 therefore use the residue encoding modules of the H.264 algorithm. The difference image is divided into macroblocs with a size of 4×4 pixels. The encoding steps of a difference macrobloc are as follows:

- transformation of the 4×4 block by a full DCT type transformation (the acronym for "discrete cosine transform"),
- quantization of the transformed data, during which it is possible to use a uniform quantization of all the difference macroblocs of a picture, and
- entropic coding by means of for example a CAVLC encoder as defined by the standard.

It should be noted that quantization makes it possible to regulate the rate of the differences.

In a second embodiment, the simulation means 316 simulates at least one of the most probable loss configurations. Each of the loss configurations is associated with a probability of occurrence that can be calculated by virtue of the loss model. For example, if N=3, the probability $P_{llr}$ of the configuration (lost, lost, received) is the probability of falling from the received state to the lost state, the probability of remaining in the lost state and the probability of returning to the received state ($P_{llr}=(p)(1-q)(q)$).

In a third embodiment, the quantization procedure implemented by the difference encoding means 320 takes account of the probability of occurrence of the loss configurations. In this way, more rate is allocated to the most probable configurations.

In a fourth embodiment, the simulation means 316 simulates the loss masking only for the configurations in which no more than K primary packets will be lost among the $N_{prim}$ primary packets transmitted. It is in fact not necessary to simulate loss configurations for which the reception device 310 of the client is not able to implement the Wyner-Ziv decoding.

Then an encoder 322 applies a channel encoding to the $N_{prim}$ slices corresponding to the difference images. Here each loss configuration is treated separately and sequentially so that there are always $N_{prim}$ difference slices input to the channel encoder 322. Use is made in the embodiment depicted in FIG. 3 of a systematic Reed-Solomon encoder 322 for the channel encoding. This encoder 322 generates K redundant slices, the number K being able to be a function either of the error rate on the channel P $$(P = \frac{p}{p+q}$$

when the channel is modeled by an Elliot-Gilbert process), or of the probability of occurrence of a loss configuration, or both. At the output of the encoder 322, only the K redundant slices are transmitted. These redundant slices are inserted in RTP packets and then transmitted over the network. An identifier of the loss configuration, of the loss masking method and of the quantization parameter QP applied to each difference image is inserted in each redundant packet transmitted. This data constitutes the parallel information supplied to the Wyner-Ziv encoder.

It will be observed that the transmission of loss masking methods is not essential. This is because knowledge by the client of the loss configuration is sufficient since, according to this configuration, the client applies his masking method selection algorithm, this algorithm being known to the server and therefore applied by this server for this same loss configuration.

When they are transmitted over the network, packets may be lost. These losses may affect in any way packets transporting primary slices or packets transporting redundant slices.

The reception device 310 of the client is composed of two principal modules, a decoder 330, implementing a conventional H.264 decoding with loss masking and comprising the means 332 and 334, and a Wyner-Ziv decoder 336 comprising the means 338 to 346.

The decoding means with loss masking 332 implements the decoding of the primary slices received by applying the loss masking if losses have occurred. The loss configuration and the masking methods applied for this configuration are stored by the storage means 334. If the number of losses in all the primary and redundant packets is less than K, the Wyner-Ziv decoder 336 is used. Otherwise the decoding of the following group of $N_{prim}$ primary slices by the decoder 332 is passed to.

The loss masking simulation means 338 compares the loss configuration stored by the storage means 336 with all the loss configurations considered during the loss masking simulation by the server or for which the transmission device has sent redundant information. A loss configuration is then sought that makes it possible to find the lost differences. If no configuration makes it possible to find the lost differences, the Wyner-Ziv decoding is stopped. Otherwise this decoding continues, relying on the loss configuration making it possible to find the lost differences, by simulation of the loss of certain images received followed by the simulation of the masking of these losses, by the simulation means 338. The simulation of these losses and of their masking enables a difference calculation means 340 to calculate the difference between a certain number of primary slices decoded by the H.264 decoder and their version on which a loss masking was simulated.

Then a quantization means 342 quantizes the differences obtained, relying on the quantization parameters transmitted in the redundant packets.

The differences reconstituted and the redundant slices corresponding to the loss configuration considered by the quantization means 340 are transmitted to a Reed-Solomon decoder 344, which regenerates the lost difference slices.

Then a difference adding means 346 adds the difference slices to the temporally corresponding images issuing from the loss masking performed by the decoder 334. Two types of image are then displayed: firstly the images resulting from the decoding of their bitstream, and secondly the images whose bitstream has been lost, but which the H.264 decoder has generated by loss masking and to which the differences obtained by Wyner-Ziv decoding have been added.

Figure 4:
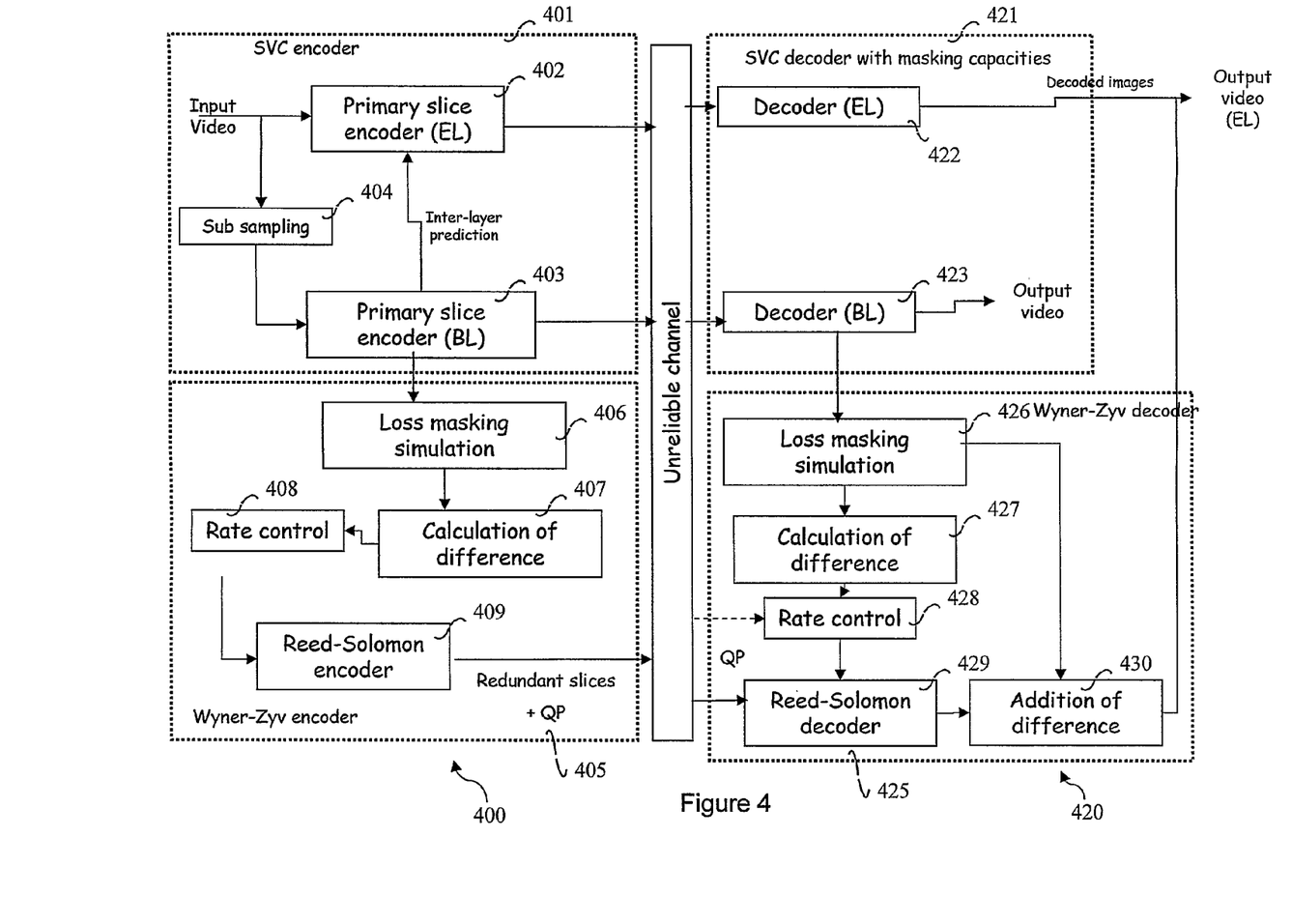
FIG. 4 depicts, schematically, a second embodiment of the transmission device and of the reception device that are objects of the present invention.

A second embodiment adapted to SVC encoding can be seen in FIG. 4. In this implementation, a scalable encoding with a base layer, denoted "BL" (the acronym for "base layer"), and an enhancement layer, denoted "EL" (the acronym for "enhancement layer") will be considered. The enhancement layer may be a spatial enhancement layer or a quality enhancement layer of the CGS type (the acronym for "coarse grain scalability") as defined by the SVC standard. It should be noted that the case of temporal scalability is covered by the embodiment in FIG. 3.

The transmission device 400 comprises an SVC encoder 401 comprising the means 402, 403 and 404, a Wyner-Ziv encoder 405 comprising the means 406, 407, 408 and 409 and a network module (not shown).

The encoding means 403 performs a primary encoding for encoding the base stream. The encoding means 402 performs a primary encoding for encoding the enhancement stream. The encoding means 402 and 403 suffice in the case of the encoding of a CGS enhancement layer. However, in the case of the encoding of a spatial enhancement layer, the subsampling means 404 subsamples the original input stream for the encoding of the base layer. The encoding means 402 and 403 exchange information so as to provide an inter-layer scalability prediction.

The base and enhancement primary slices are inserted in RTP packets using for example the format described in the article by S. Wenger, Y. K. Wang, T Schierl, "RTP payload format for SVC video, draft-wenger-avt-rtp-svc-03.txt", October 2006, and then transmitted over the network 410 by the network module.

It is considered here that the base primary packets and the enhancement primary packets are transmitted in different RTP sessions, so that the losses suffered by one or other scalability layer are decorrelated. In addition, the base packets are protected more than the enhancement packets, by giving them for example higher priority levels, so as to ensure an almost reliable transmission of the base layer.

As soon as $N_{prim}$ base packets and $N_{prim}$ enhancement packets have been created, the transmission device uses the Wyner-Ziv encoder 405. As in the embodiment illustrated in FIG. 3, the Wyner-Ziv encoder 405 comprises a loss masking simulation means 406 for various loss configurations. In the context of scalability as described above, a simple loss masking method consists of replacing an image of the lost enhancement layer with the image of the temporally corresponding base layer. In the example embodiment illustrated in FIG. 4, only this loss masking method is used. In addition, among the loss configurations considered by the server, at least the configuration is considered in which all the $N_{prim}$ enhancement packets are lost. The Wyner-Ziv encoder 405 comprises a calculation means 407 that calculates the difference between the image obtained after decoding of the enhancement layer and the image resulting from the decoding of the base layer. It should be noted that an interpolation of the image of the base layer may be necessary if the two scalability layers do not have the same spatial resolution. In this case, the calculation of the difference amounts to calculating this difference between the image of the enhancement layer and the image of the base layer. This difference image is encoded using the rate regulation means 408 in the same way as described with regard to FIG. 3.

The Reed-Solomon encoding means 409 is identical to that illustrated in FIG. 3. However, here, since only one masking method is considered, it is not necessary to insert an identifier of this method. As in the embodiment illustrated in FIG. 3, the K redundant packets are transmitted over the network 410.

For its part, the reception device 420 of the client comprises an SVC decoder 421 that performs the decoding of the images received, using its decoding means 422 and 423, respectively for decoding the primary slices and the secondary slices.

The loss masking means (not shown) of the decoder masks the lost images, in the same way as the means 406 of the transmission device 400. It should be noted that an image referring to a lost image will be considered to be lost in order to avoid the problems of error propagation.

If among the $N_{prim}$ primary enhancement packets and the K redundant packets, no more than K packets are lost, the reception device 420 uses the Wyner-Ziv decoder 425. Wyner-Ziv decoding consists of seeking a loss configuration that makes it possible to find the lost differences among the loss configurations considered by the transmission device 400. It will be possible to consider the loss configuration where all the $N_{prim}$ packets are lost.

In this configuration, a loss masking simulation means 426 replaces each of the images of the enhancement level transported in the $N_{prim}$ packets by the corresponding images of the base layer. The calculation means 427 calculates the difference between each enhancement image received and its version obtained by loss masking. The quantization means 428 quantizes this difference, relying on the quantization information indicated in the redundant packets. The differences quantized and the redundant slices will be transmitted to the Reed-Solomon decoder 429, which recovers the missing differences and decodes them. An addition means 430 adds these differences to the lost images of the enhancement layer that have been regenerated by loss masking. The images resulting from these additions are inserted in the remainder of the images to be displayed.

Figure 6:
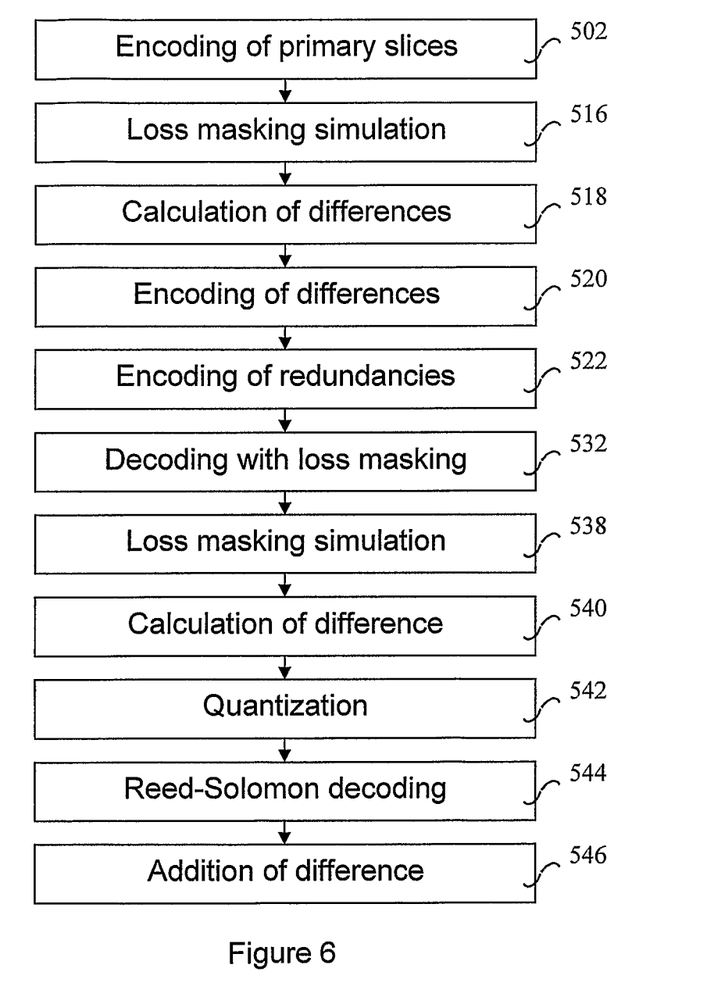
FIG. 6 depicts, in the form of a logic diagram, steps implemented in a first embodiment of the transmission method and of the reception method that are objects of the present invention.

There can be seen, in FIG. 6, a first embodiment of the transmission and reception methods that are the objects of the present invention, suited to the case of any video transmission allocation but described in the case of H.264 encoding. Thus other video compression standards could be used (MPEG-2, MPEG-4 part 2, H.263, Motion JPEG, Motion JPEG2000, etc.) without substantial modification to the steps illustrated in FIG. 6.

During a step 502, the H.264 standard is used to encode an input video, in the form of slices that are referred to hereinafter as "primary" slices. Each primary slice is inserted in RTP packets and then transmitted over a network. It is assumed that a congestion control mechanism, of a known type, regulates the sending of the RTP packets over the network and that the reception device of the client acknowledges each packet received so that the sending device knows which packets have been received and which packets have been lost.

As soon as a group of $N_{prim}$ primary slices have been generated, a step 516 of simulating the loss masking methods that would be used by the reception device of the client in the case of the loss of packets among the $N_{prim}$ packets transmitted is performed. In the general case, the reception device of the client is capable of implementing several loss masking methods. It may for example perform a spatial loss masking or a temporal loss masking.

Simulating the loss masking assumes having a knowledge of the loss process on the network. With the transmission device receiving an acknowledgement for each packet transmitted, during the simulation step 516, it is possible to calculate the parameters of a loss model on the network.

In embodiments, during the simulation step 516, all the possible loss configurations between the last primary slice acknowledged and the current slice are simulated. If N is the number of packets transporting the slices transmitted since the last primary slice acknowledged, during the simulation step 516, all the configurations from 1 to N losses are simulated. For example, if N packets separate the last packet acknowledged and the packet containing the current slice, the number of possible loss configurations is $$\sum_{k=1}^{N} \frac{N!}{k!(N-k)!}.$$

The number of possible configurations can be reduced if, among the N primary packets transmitted, a certain number were acknowledged before the Wyner-Ziv encoding.

For each of the possible loss configurations, during the simulation step 516, the loss masking is applied by applying the same process of selecting a loss masking method as the reception device of the client. Selecting a loss masking method may for example consist of applying a temporal loss masking when the slices contained in a lost packet correspond to an image, and a spatial loss masking when the slices correspond to a portion of an image. It is assumed here that all the macroblocs of a slice are subjected to the same loss masking method.

The simulation step 516 thus generates several decoded versions of the video, each version representing the video as would be displayed by the client in a given loss configuration.

Then, during a calculation step 518, there is performed, for each of the loss configurations obtained, the calculation of the difference between the images issuing from the loss masking and the primary images that correspond to them in time.

During an encoding step 520, each of the differences is encoded. The macroblocs of a difference image are treated as residue macroblocs issuing from the motion prediction. The encoding step 520 therefore uses the residue encoding modules of the H.264 algorithm. The difference image is divided into macroblocs with a size of 4×4 pixels. The steps of encoding a difference macrobloc are as follows:

transformation of the 4×4 block by a transformation of the full DCT type (the acronym for "discrete cosine transform"), quantization of the transformed data, during which it is possible to use a uniform quantization of all the difference macroblocs of an image, and entropic coding using, for example, a CAVLC encoder as defined by the standard.

It should be noted that quantization makes it possible to regulate the rate of the differences.

In a second embodiment, during the simulation step 516, at least one of the most probable loss configurations is simulated. In a third embodiment, the quantization procedure implemented during the differences encoding step 520 takes into account the probability of occurrence of the loss configurations. In this way, more rate is allocated to the most probable configurations.

In a fourth embodiment, during the simulation step 516, the loss masking is simulated only for the configurations in which no more than K primary packets will be lost among the $N_{prim}$ primary packets transmitted. It is in fact not necessary to simulate loss configurations for which the reception device of the client is not able to implement the Wyner-Ziv decoding.

Then, during an encoding step 522, a channel encoding is applied to the $N_{prim}$ slices corresponding to the difference images. Here, each loss configuration is treated separately and sequentially so that there are always $N_{prim}$ difference slices at the input of the encoding step 522. A systematic Reed-Solomon encoding is used, in the embodiment depicted in FIG. 6, for the channel encoding. This encoding 522 generates K redundant slices, the number K being able to be a function either of the error rate on the P channel $$(P = \frac{p}{p+q})$$

when the channel is modeled by an Elliot-Gilbert process), or the probability of occurrence of a loss configuration, or both. At the output of the encoding step 522, only the K redundant slices are transmitted. These redundant slices are inserted in RTP packets and then transmitted over the network. An identifier for the loss configuration, the loss masking method and the quantization parameter QP applied to each difference image is inserted in each redundant packet transmitted. This data constitutes the parallel information supplied to the Wyner-Ziv encoder.

When they are transmitted over the network, packets may be lost. These packets may affect in any way packets transporting primary slices or packets transporting redundant slices.

The reception device performs two main sets of steps, a conventional H.264 decoding with loss masking 532, and a Wyner-Ziv decoding comprising steps 538 to 546.

During the decoding step with loss masking 532, the decoding of the primary slices received is implemented by applying loss masking if losses have occurred.

If the number of losses in all the primary and redundant packets is less than K, the Wyner-Ziv decoding is implemented. Otherwise the decoding of the following group of $N_{prim}$ primary slices is passed to.

For the Wyner-Ziv decoding, during a loss masking simulation step 538 the loss configuration is compared with all the loss configurations considered during the simulation of the loss masking performed during the encoding. Then a loss configuration is sought that makes it possible to find the lost differences. If no configuration makes it possible to find the lost differences, the Wyner-Ziv decoding is stopped. Otherwise this decoding is continued, relying on the loss configuration making it possible to find the lost differences, by simulation of the loss of certain images received followed by simulation of the masking of these losses, performed during the simulation step 538. The simulation of these losses and of the masking makes it possible, during a step 540, to calculate the difference between a certain number of primary slices decoded by the H.264 decoder and their version on which a loss masking was simulated.

Then, during a quantization step 542, the differences obtained are quantized, relying on the quantization parameters transmitted in the redundant packets.

The differences reconstituted and the redundant slices corresponding to the loss configuration considered during step 540 are used during a Reed-Solomon decoding step 544, which regenerates the lost difference slices.

Then, during a difference addition step 546, the difference slices are added to the temporally corresponding image issuing from the loss masking performed during the decoding step 532. Two types of image are therefore displayed: firstly the images resulting from the decoding of their bitstream, secondly the images whose bitstream has been lost, but which the H.264 decoder has generated by loss masking and to which the differences obtained by Wyner-Ziv decoding have been added.

Figure 7:
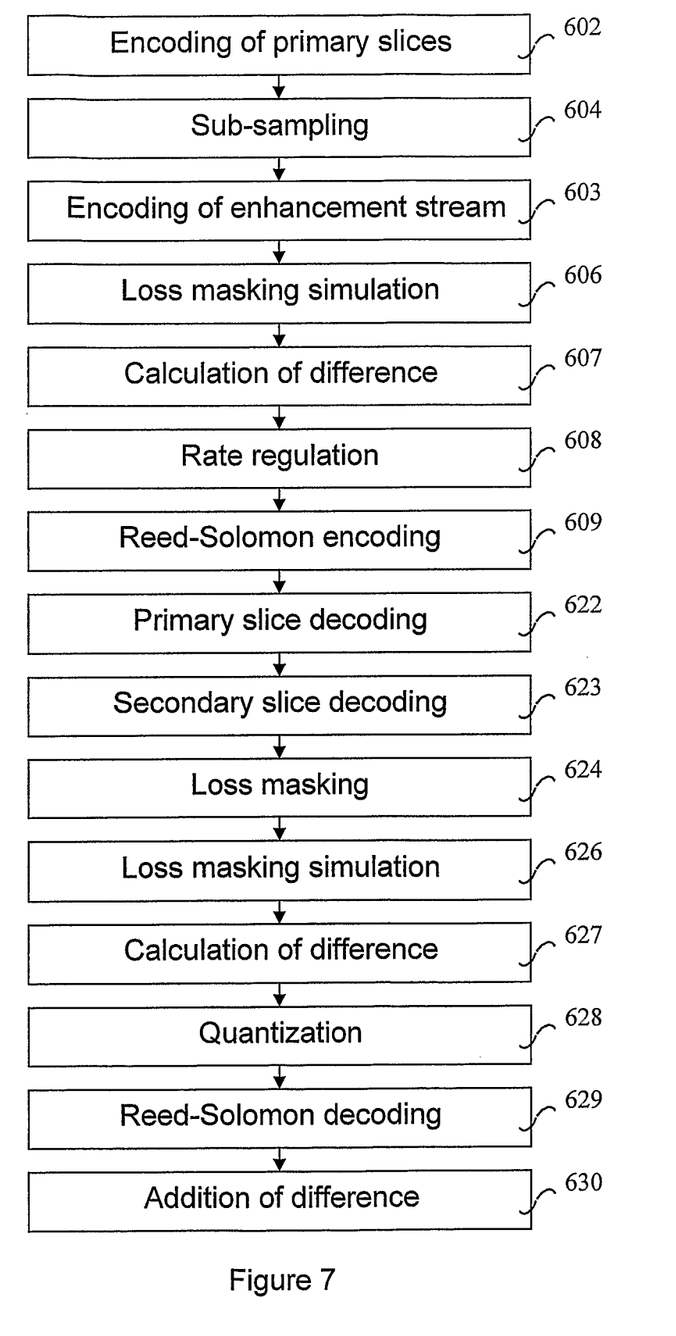
FIG. 7 depicts, in the form of a logic diagram, steps implemented in a second embodiment of the transmission method and of the reception method that are objects of the present invention.

A second embodiment of the transmission and reception methods that are objects of the present invention adapted to SVC encoding can be seen in FIG. 7. In this embodiment, we will consider a scalable encoding with a base layer and enhancement layer. The enhancement layer may be a spatial enhancement layer or a quality enhancement layer of the CGS type (the acronym for "coarse grain scalability") as defined by the SVC standard. It should be noted that the case of temporal scalability is covered by the implementation of the method illustrated in FIG. 6.

The transmission method comprises a group of SVC encoding steps comprising steps 602, 603 and 604 and a group of Wyner-Ziv encoding steps comprising steps 606, 607, 608 and 609.

During an encoding step 602, a primary encoding is performed in order to encode the base stream. During a step 603, a primary encoding is performed in order to encode the enhancement stream. The encoding steps 602 and 603 suffice in the case of the encoding of a CGS enhancement layer. However, in the case of the encoding of a spatial enhancement layer, a subsampling step 604 subsamples the original input stream for the encoding of the base layer. The encoding steps 602 and 603 exchange information so as to provide an inter-layer scalability prediction.

The base and enhancement primary slices are inserted in RTP packets and then transmitted over the network.

It is considered here that the base primary packets and the enhancement primary packets are transmitted in different RTP sessions, so that the losses suffered by one or other scalability layer are decorrelated. In addition, the base packets are protected more than the enhancement packets, by giving them for example higher priority levels, so as to ensure an almost reliable transmission of the base layer.

As soon as $N_{prim}$ base packets and $N_{prim}$ enhancement packets have been created, the Wyner-Ziv encoding steps are implemented. As in the embodiment illustrated in FIG. 6, the Wyner-Ziv encoding comprises a loss masking simulation step 606 for various loss configurations. In the context of scalability as described above, a simple loss masking method consists of replacing an image of the lost enhancement layer with the image of the temporally corresponding base layer. In the example embodiment illustrated in FIG. 7, only this loss masking method is used. In addition, among the loss configurations considered by the server, at least the configuration is considered in which all the $N_{prim}$ enhancement packets are lost. The Wyner-Ziv encoding comprises a step 607 of calculating the difference between the image obtained after decoding of the enhancement layer and the image resulting from the decoding of the base layer. It should be noted that an interpolation of the image of the base layer may be necessary if the two scalability layers do not have the same spatial resolution. In this case, the calculation of the difference amounts to calculating this difference between the image of the enhancement layer and the image of the base layer. This difference image is encoded after a rate regulation step 608 in the same way as described with regard to FIG. 6.

During a step 609, a Reed-Solomon encoding identical to that illustrated in FIG. 6 is performed. However, here, since a single masking method is considered, it is not necessary to insert an identifier of this method. As in the embodiment illustrated in FIG. 6, the K redundant packets are transmitted over the network.

For its part, the reception method comprises a group of SVC decoding steps performing the decoding of the images received, during steps 622 and 623, respectively for decoding the primary slices and the secondary slices.

During a loss masking step 624, the lost images are masked, in the same way as during step 606. It should be noted that an image referring to a lost image will be considered to be lost in order to avoid problems of error propagation.

If, among the primary enhancement packets and the K redundant packets, no more than K packets are lost, the Wyner-Ziv decoding steps are implemented, which consists of seeking a loss configuration that makes it possible to find the lost differences among the loss configurations considered by the transmission method. The loss configuration where all the $N_{prim}$ packets are lost can be considered.

In this configuration, during a loss masking simulation step 626, each of the images of the enhancement layer transported in the $N_{prim}$ packets by the corresponding images of the base layer is replaced. During a calculation step 627, the difference is calculated between each enhancement image received and its version obtained by loss masking. During a quantization step 628, this difference is quantized, relying on the quantization information indicated in the redundant packets. The quantized differences and the redundant slices will be used during a Reed-Solomon decoding step 629, during which the missing differences are recovered and decoded. During an addition step 630, these differences are added to the lost images of the enhancement layer regenerated by the loss masking. The images resulting from these additions are inserted in the remainder of the images to be displayed.

Figure 8:
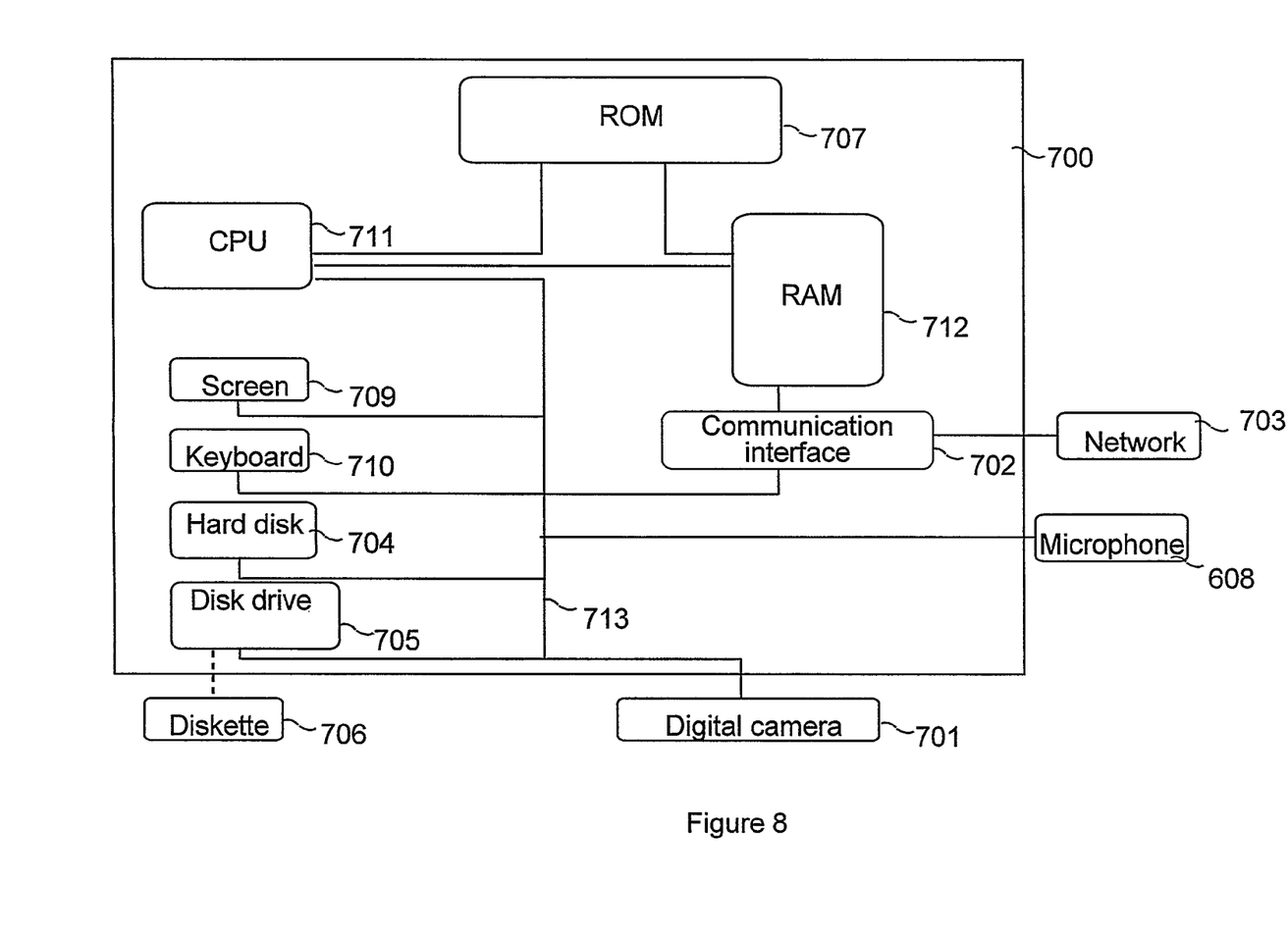
FIG. 8 depicts, schematically, the hardware configuration of a particular embodiment of a transmission device and reception device that are objects of the present invention.

With reference to FIG. 8, a device able to function as a video stream transmission device and/or reception device according to the invention is now described in its hardware configuration.

The information processing device of FIG. 8 has all the means necessary for implementing the video stream transmission method and/or reception method according to the invention.

According to the embodiment chosen, this device may for example be a microcomputer 700 connected to various peripherals, for example a digital camera 701 (or any other image acquisition or storage means) connected to a graphics card (not shown) and thus supplying a video stream to be transmitted or received.

The microcomputer 700 preferably comprises a communication interface 702 connected to a network 703 able to transmit digital information. The microcomputer 700 also comprises a storage means 704 such as for example a hard disk, as well as a disk drive 705.

The diskette 706, like the disk 704, can contain software location data of the invention as well as the code of a program implementing the transmission method and/or the reception method that are objects of the present invention, a code which, once read by the microcomputer 700, will be stored on the hard disk 704.

According to a variant, the program or programs enabling the device 700 to implement the invention are stored in a read only memory ROM 707.

According to another variant, the program or programs are received completely or partially through the communication network 703 in order to be stored as indicated.

The microcomputer 700 can also be connected to a microphone 708 by means of an input/output card (not shown). The microcomputer 700 also comprises a screen 709 for displaying the video to be encoded or the decoded video and/or serving as an interface with the user, so that the user can for example parameterize certain processing modes by means of the keyboard 710 or any other suitable means such as a mouse.

The central unit CPU 711 executes the instructions relating to the implementation of the invention, these instructions being stored in the read only memory ROM 707 or in the other storage elements described.

On powering up, the processing programs and methods stored in one of the non-volatile memories, for example the ROM 707, are transferred into the random access memory RAM 712 which then contains the executable code of the invention as well as the variables necessary for implementing the invention.

In general terms, an information storage means that can be read by a computer or a microprocessor, integrated or not into the device, possibly removable, stores a program, the execution of which implements the transmission or reception methods. It is also possible to change the embodiment of the invention, for example by adding updated or enhanced processing methods that are transmitted by the communication network 703 or loaded by means of one or more diskettes 706. Naturally the diskettes 706 can be replaced by any information medium such as a CD-ROM or memory card.

a) A communication bus 713 affords communication between the various elements of the microcomputer 700 and the elements connected to it. It should be noted that the representation of the bus 713 is not limiting. This is because the central unit CPU 711 is for example able to communicate instructions to any element of the microcomputer 700, directly or by means of another element of the microcomputer 700.

Naturally the present invention is in no way limited to the embodiments described and depicted but quite the contrary encompasses any variant within the capability of a person skilled in the art.

The invention claimed is:

1. A method of transmitting a video stream over a network between a transmission device and at least one reception device, comprising:
  a step of encoding primary video data of the video stream according to a first type of encoding;
  a step of obtaining secondary video data of said video stream, dependent on the encoded primary data, comprising obtaining at least one degraded version of reconstructed encoded primary video data by the simulation of packet losses potentially suffered by packets transporting the encoded primary video data and at least one method of masking losses due to packet losses able to be implemented by a reception device able to decode the primary video data encoded according to the first type of encoding, wherein the simulation of packet losses and loss masking comprises applying a loss masking process during the reconstruction of encoded primary video data contained in lost packets to generate the at least one degraded version of the reconstructed encoded primary video data;
  a step of encoding a difference calculated during the step of obtaining secondary video data according to a second type of encoding different from the first type of encoding to obtain encoded secondary video data; and
  a step of transmitting, by means of the network, primary video data encoded according to the first type of encoding and at least some of the secondary video data encoded with the second type of encoding, wherein, during the step of obtaining secondary video data, the difference is calculated between the images corresponding to said at least one degraded version of the reconstructed encoded primary video data and the temporally corresponding images resulting from decoding of lossless encoded primary video data.

2. A method according to claim 1, wherein, during the step of encoding the secondary data, said difference is encoded.

3. A method according to claim 1, wherein, during the step of encoding the secondary data, redundant information is calculated on this difference in order to supply secondary data.

4. A method according to claim 3, wherein, during the transmission step, this redundant information is transmitted in the form of data packets in which information is inserted enabling the client to regenerate the secondary data.

5. A method according to claim 4, wherein, during the transmission step, the information enabling the differences to be regenerated comprises an identifier of a loss masking method used to determine the secondary data.

6. A method according to claim 4, wherein, during the transmission step, the information enabling the differences to be regenerated comprises an identifier of a loss configuration used for determining the secondary data.

7. A method according to claim 1, wherein, during the step of obtaining the secondary data, the loss masking is simulated only for loss configurations in which at most a predetermined number of primary packets are lost among the primary packets transmitted.

8. A method according to claim 1, wherein the step of encoding the secondary data comprises a step of quantizing the secondary data, during which account is taken of the probability of occurrence of loss configurations and more rate is allocated to the most probable configurations.

9. A method according to claim 1, wherein, during the step of encoding the primary data, an SVC encoding is implemented.

10. A method according to claim 1, wherein, during the step of obtaining secondary video data, a loss masking using a base layer and an enhancement layer is simulated.

11. A method according to claim 1, wherein, during the secondary data encoding step, a Reed-Solomon encoding is implemented.

12. A method according to claim 1, wherein, during the step of obtaining secondary data, during the loss masking simulation, for the most probable loss configuration, a process of selecting a loss masking method implemented by the reception device is applied, in order to supply at least one decoded version of the video data, each version representing the video as would be displayed by the client in a given loss configuration.

13. A method of receiving a video stream over a network coming from a transmission device, comprising:
    a step of receiving primary data and information representing secondary data of a video stream;
    a step of decoding primary data according to a first decoding type; a step of primary data loss masking;
    a step of calculating differences between the decoded primary data and the data resulting from the loss masking;
    a step of obtaining secondary video data, by implementing, on the information representing secondary data, a second type of decoding different from the first type of decoding and said differences, wherein the loss of received images and the masking of these losses are simulated, in order to determine a difference between decoded primary data and their version on which a loss masking was simulated.
    a step of adding the secondary data to primary data on which a loss masking process had been applied and combining the result of the addition to the primary data in order to generate a decoded video stream.

14. A method according to claim 13, wherein, during the combination step, the secondary data is added to the primary data.

15. A method according to claim 13, wherein, during the step of obtaining secondary video data, the loss configuration used during the primary data loss masking step is compared with a plurality of loss configurations for which the secondary data has been received, in order to determine secondary data corresponding to said loss configuration.

16. A device for transmitting a video stream to at least one reception device, comprising:
    means for encoding primary video data of the video stream according to a first type of encoding;
    means for obtaining secondary video data of said video stream, dependent on the encoded primary data, comprising obtaining at least one degraded version of reconstructed encoded primary video data by the simulation of packet losses potentially suffered by packets transporting the encoded primary video data and at least one method of masking losses due to packet losses and able to be implemented by a reception device suitable for decoding the primary video data encoded according to the first type of encoding, wherein the simulation of packet losses and loss masking comprises applying a loss masking process during the reconstruction of encoded primary video data contained in lost packets to generate the at least one degraded version of the reconstructed encoded primary video data;
    means for encoding a difference calculated during the step of obtaining secondary video data according to a second type of encoding to obtain encoded secondary video data; and
    means for transmitting, by means of the network, primary video data encoded according to the first type of encoding and at least some of the secondary video data encoded with the second type of encoding,
    wherein the means for obtaining secondary video data calculates the difference between the images corresponding to said at least one degraded version of the reconstructed encoded primary video data and the temporally corresponding images resulting from decoding of lossless encoded primary video data.

17. A device for receiving a video stream over a network coming from a transmission device, comprising:
    means for receiving primary data and information representing secondary data of a video stream;
    means for decoding primary data according to the first type of decoding; means for masking primary data losses;
    means for calculating differences between the decoded primary data and the data resulting from the loss masking;
    means for obtaining secondary video data, by implementing, on the information representing secondary data, a second type of decoding different from the first type of decoding and said differences, wherein the loss of received images and the masking of these losses are simulated, in order to determine a difference between decoded primary data and their version on which a loss masking was simulated;
    means for adding the secondary data to primary data on which a loss masking process had been applied and combining the result of the addition to the primary data in order to generate a decoded video stream.

18. A non-transitory computer-readable storage medium storing instructions of a computer program, that allows the implementation of the transmission method according to claim 1.

* * * * *